United States Patent [19]
Oizumi et al.

[11] Patent Number: 5,485,497
[45] Date of Patent: Jan. 16, 1996

[54] OPTICAL ELEMENT AND PROJECTION EXPOSURE APPARATUS EMPLOYING THE SAME

[75] Inventors: Hiroaki Oizumi, Kokubunji; Masaaki Ito, Higashi-Murayama; Takashi Soga, Hachioji; Taro Ogawa, Tachikawa; Kozo Mochiji, Tokorozawa; Eiji Takeda, Koganei, all of Japan

[73] Assignee: Hitachi, Ltd., Tokyo, Japan

[21] Appl. No.: 195,047

[22] Filed: Feb. 14, 1994

Related U.S. Application Data

[63] Continuation of Ser. No. 974,884, Nov. 12, 1992, abandoned.

[30] Foreign Application Priority Data

Nov. 12, 1991 [JP] Japan ................................. 3-295476
Aug. 20, 1992 [JP] Japan ................................. 4-221237

[51] Int. Cl.$^6$ ........................................ G21K 5/00
[52] U.S. Cl. .............................. 378/84; 378/34
[58] Field of Search ................ 378/84, 85, 34, 378/35

[56] References Cited

U.S. PATENT DOCUMENTS

| | | | |
|---|---|---|---|
| 4,192,994 | 3/1980 | Kastner | 378/145 |
| 4,411,013 | 10/1983 | Takasu et al. | 378/34 |
| 4,891,830 | 1/1990 | Iwahashi | 378/35 |
| 5,003,567 | 3/1991 | Hawryluk et al. | 378/34 |
| 5,052,033 | 9/1991 | Ikeeta et al. | 378/35 |

FOREIGN PATENT DOCUMENTS 3-96220  4/1991  Japan ................................. 378/35

OTHER PUBLICATIONS

Japanese Journal of Applied Physics, vol. 30, No. 11B, Nov., 1991, "Soft X–Ray Reduction Lithography Using Multilayer Mirrors", H. Kinoshita et al, pp. 3048–3052.

Extended Abstracts of the 18th (1986 International) Conference on Solid State Devices and Materials, Tokyo, 1986, "Theoretical Consideration on New Reflection Type X–Ray Lithography", H. Matsumura, pp. 17–20.

*Primary Examiner*—Craig E. Church
*Attorney, Agent, or Firm*—Fay, Sharpe, Beall, Fagan, Minnich & McKee

[57] ABSTRACT

An optical element which allows replication of a refined pattern and a projection exposure apparatus employing the optical element are disposed so that side face portions of predetermined patterns which create shadows from oblique incident exposure radiation may be minimized at a predetermined incidence angle of vacuum ultrasonic radiation or X-radiation, or the patterns of the optical element are formed such that the direction in which incident radiation is reflected regularly and the direction of side faces of the patterns may extend in parallel to each other. When the optical element is irradiated to replicate or image the patterns of the optical element, refined patterns can be replicated or imaged.

24 Claims, 16 Drawing Sheets

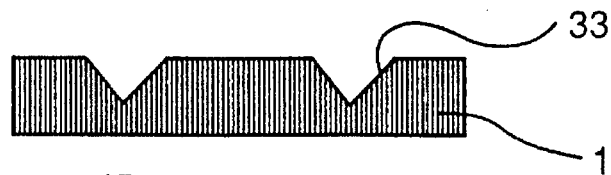
Fig. 5(a)
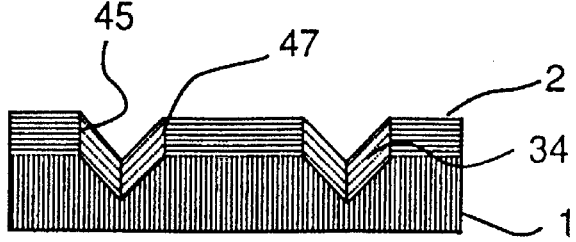
Fig. 5(b)
Fig. 6
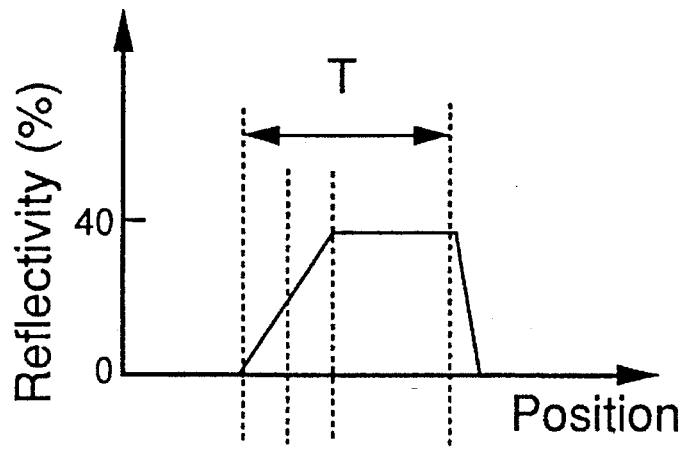
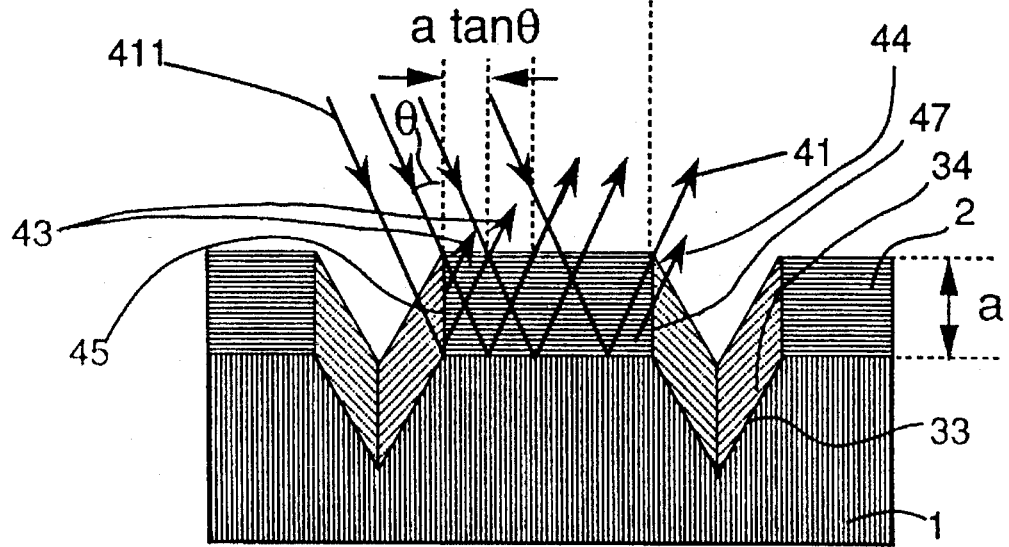

OPTICAL ELEMENT AND PROJECTION EXPOSURE APPARATUS EMPLOYING THE SAME

This is a continuation application of Ser. No. 07/974,884, filed Nov. 12, 1992, abandoned.

BACKGROUND OF THE INVENTION

This invention relates to an optical element which is used to effect imaging by irradiation of a vacuum using ultraviolet radiation or X-radiation and a projection exposure apparatus employing the optical element, and more particularly to a reflection mask for X-ray reduction lithography for use for pattern replication of a semiconductor device and a projection exposure apparatus employing the reflection mask.

Refinement of a circuit pattern has been and is proceeding in order to enhance the degree of integration and the response speed of an LSI solid state device. A reduction projection exposure method which employs ultraviolet radiation for exposure is used popularly for the formation of a circuit pattern at present. The resolution in the method increases in proportion to the exposure wavelength $\lambda$ but in inverse proportion to the numerical aperture NA of the projection optical system. Enhancement of the resolution limit has been achieved by increasing the numerical aperture NA. This method, however, is approaching its limit due to a decrease of the depth of focus and the difficulty in designing and manufacturing the reflection optical system (lens or lenses).

Therefore, there is a current attempt to shorten the exposure wavelength $\lambda$. The shortening of the exposure wavelength $\lambda$ can be seen, for example, from the change-over from the g line ($\lambda$=435.8 nm) to the i line ($\lambda$=365 nm) of a mercury lamp and further to a KrF excimer laser ($\lambda$=248 nm). The resolution is enhanced by shortening of the exposure wavelength. However, from a limit in principle originating from the magnitude of a wavelength of ultraviolet radiation used for exposure, it is difficult to obtain the resolution of 0.1 µm or less using a conventional exposure technique.

Meanwhile, one of the methods of forming a refined pattern is proximity X-ray lithography which employs soft X-rays having an exposure wavelength of 0.5 nm to 2 nm. This method may probably provide a high resolution of 0.1 µm or less in principle since the exposure wavelength is short.

Generally, in order to form a circuit pattern, a mask pattern is replicated on a resist on a wafer. In proximity X-ray lithography, a transmission mask called a proximity X-ray mask is employed. A portion of the proximity X-ray mask through which an X-ray is to pass is constituted from a thin film, or membrane, formed from a light-element material such as Si, SiN or C and normally having a thickness of 2 µm or so. At another portion of the proximity X-ray mask at which an X-ray is absorbed, a circuit pattern called an X-ray absorber of a heavy metal such as W, Au or Ta having a thickness of 0.5 µm to 1.0 µm or so is formed on the membrane.

Accordingly, a proximity X-ray mask has the problem that, since a circuit pattern is formed on a membrane having very low rigidity, the circuit pattern is sometimes deformed by an internal stress of the heavy metal of the X-ray absorber, an external force acting thereupon when the X-ray mask is loaded onto a predetermined exposure apparatus or by some other cause, and consequently, the desired circuit pattern cannot be replicated on a resist on a wafer. Particularly in proximity X-ray lithography, since a pattern of a proximity X-ray mask is replicated equally at the multiplying factor of 1, deformation of the pattern on the proximity X-ray mask is replicated also equally at the multiplying factor of 1. The problem of deformation of a pattern on a proximity X-ray mask having low rigidity is a serious subject in proximity X-ray lithography.

On the background described above, attention has been paid in recent years to X-ray reduction lithography, which employs vacuum ultraviolet radiation or soft X-rays as an exposure source. The X-ray reduction lithography is disclosed, for example, in *Japanese Journal of Applied Physics*, Vol. 11B, No. 30, 1991, p. 3,051.

FIG. 1 shows an example of an exposure optical system for X-ray reduction lithography. Vacuum ultraviolet radiation or soft X-radiation 411 is employed as an exposure source and is introduced obliquely at an incidence angle $\theta$ to irradiate a reflection mask 81. While the incidence angle $\theta$ may differ among different optical systems, it ranges from 1° to 15° or so. In order to prevent radiation reflected from a mask from being obscured by a reflection optical system, an exposure optical system for X-ray reduction lithography does not allow the incidence angle of 0° (normal incidence).

The reflection mask 81 has a multilayer 21 formed thereon which can regularly reflect the vacuum ultraviolet radiation or soft X-rays 411. A predetermined pattern is formed on the multilayer 21. The vacuum ultraviolet radiation or soft X-rays 411 reflected from the reflection mask 81 are then reflected by a convex mirror 92 and then by a concave mirror 91 and imaged on a wafer 82. A multilayer 7 is formed on each of the convex mirror 92 and the concave mirror 91. Generally, when an xyz coordinate system is employed with such an optical system as described above and as shown in FIG. 1, the x direction is called the tangential direction, and the y direction is called the sagittal direction. In order to expand an exposure field of a mask and an exposure area of a wafer in such an optical system as shown in FIG. 1, the mask is sometimes scanned in the tangential direction in synchronism with the wafer.

In accordance with the invention, a multilayer which is used as a reflecting mirror for vacuum ultraviolet radiation or X-rays is a film wherein at least two different substances having different refraction factors are layered alternately with the thickness thereof adjusted so as to make a predetermined cycle, and the reflectivity of the multilayer against the vacuum ultraviolet radiation or the X-rays depends upon the number of layer pairs of the film when the wavelength and the incidence angle of the vacuum ultraviolet radiation or the X-rays are fixed.

For example, the relationship between the number of layer pairs of Ni and C and the reflectivity of a Ni/C multilayer when nickel (Ni) having a thickness of 1.27 nm and carbon (C) having a thickness of 1.27 nm are alternately layered each by 200 layers (by 200 cycles with the cycle length of 2.54 nm) to form the Ni/C multilayer is shown in FIG. 2. Here, the wavelength of an X-ray used to illuminate the multilayer is 5 nm, and the incidence angle of the X-rays is 10°.

The reflectivity of the multilayer increases as the number of layer pairs of Ni and C which contribute to reflection increases, and finally becomes saturated with about 160 layer pairs (cycles) or so. Accordingly, when the wavelength of an X-ray used for exposure is 5 nm and the incidence angle of the X-ray is 10° using a Ni/C multilayer as a reflecting mirror, a thickness of about 0.4 µm or more is necessary in order to obtain effective reflectivity.

A conventional reflection X-ray mask is normally constructed such that, as disclosed, for example, in *Extended Abstracts of the 18th Conference on Solid State Devices and Material,* 1986, pp. 17–20, a region in which it has a comparatively high reflectivity with regard to vacuum ultraviolet radiation or X-rays is formed as a portion in which a multilayer exists, while another region in which it has a comparatively low reflectivity or has a reflectivity substantially equal to zero is formed as a portion in which no multilayer or no multilayer structure exists.

In the reflection mask shown in FIG. 3, a multilayer 2 on a substrate 1 is removed at a certain portion thereof to form a low- or no-reflectivity region 3 in which the reflectivity is low or substantially equal to zero. The portion at which the multilayer 2 remains is a high-reflectivity region. A pattern is formed on the reflection mask by an arrangement of the low- or no-reflectivity regions 3 and the high-reflectivity regions.

FIG. 4 shows the relationship between the position of the pattern of a reflection mask and the reflected light intensity of incident radiation when, using the reflection mask shown in FIG. 3, vacuum ultraviolet radiation or X-radiation 411 is introduced as incident exposure at a predetermined incidence angle ($\theta > 0°$) into the reflection mask. Here, side faces of a left-hand side boundary 45 and a right-hand side boundary 47 of the pattern of the reflection mask extend perpendicularly to the surfaces of the substrate.

The incident radiation 411 is introduced obliquely at the incidence angle $\theta$ ($>0°$) from the left into the mask. Reflected radiation 41 has an ordinary intensity. Where the thickness of the pattern is represented by a, the total number of the layered films of the multilayer which contribute to reflection of the incident radiation 411 is decreased at the location spaced by $2a \cdot \tan\theta$ from the left-hand side boundary 45 of the pattern 22. Consequently, the intensity of the reflected radiation 43, that is, the reflectivity, decreases at the location spaced by $2a \cdot \tan\theta$ from the left-hand side boundary 45 of the pattern.

Further, there is another problem that, when the radiation 411 is incident from the left in FIG. 4, the reflected radiation escapes at the location spaced by $a \cdot \tan\theta$ from the right-hand side face 47 of the pattern-like reflected radiation 44. Accordingly, since the intensity of reflected radiation decreases at the left-hand side boundary 45 of the pattern while the intensity of reflected radiation exists on the outer side of the width T of the pattern at the right-hand side boundary 47 of the pattern, a problem takes place in imaging and replication of a mask pattern of a desired size.

Another reflection mask is disclosed in Japanese Patent Laid-Open Application No. 1-152725 and is shown in FIGS. 5(a) and 5(b). Referring to FIG. 5(a), the surface of a substrate 1 of a reflection mask is removed in advance by etching to make concave structures 33 to form a predetermined pattern in which the concave structures 33 serve as non-reflecting portions. A multilayer reflecting mirror is then formed on the surface of the substrate so as to form reflecting portions and non-reflecting portions 34 from the convex (unetched) structure portions and the concave structure portions, respectively (FIG. 5(b)).

The manufacturing process of the reflection mask is advantageous in that, since a multilayer is formed after a pattern has been formed in advance, the opportunity for a defect to take place in the multilayer in the manufacturing process is small. However, since no attention is paid to the angles of a left-hand side boundary 45 and a right-hand side boundary 47 of a pattern with respect to incident radiation, the reflected radiation intensity is lower at the boundaries of the pattern similarly as in the mask shown in FIG. 4.

FIG. 6 shows the relationship between the position of the pattern and the reflected radiation intensity. Since the intensity of reflected radiation decreases at the left-hand side boundary 45 of the pattern while the intensity of reflected radiation exists on the outer side of the width T of the pattern at the right-hand side boundary 47 of the pattern, a problem takes place in imaging and replication of a mask pattern of a desired size.

A further reflection mask is disclosed in Japanese Patent Laid-Open Application No. 64-4021 wherein, as shown in FIG. 7, absorber patterns 35 each having a predetermined thickness and a predetermined profile are formed as non-reflecting portions on a multilayer 2. With the mask structure, however, since the absorber patterns 35 have a predetermined thickness b, reflecting portions and non-reflecting portions have a step therebetween. FIG. 8 shows the relationship between the position of the pattern and the reflected radiation intensity. Similarly as for the two masks described above, on the left-hand side of each pattern, the total number of those layers of the multilayer which contribute to reflection of the incident radiation 411 is decreased at the location spaced by $2a \cdot \tan\theta$ from the left-hand side boundary 45 of the pattern, and the intensity of the reflected radiation 43, that is, the reflectivity, decreases there. Further, since a shadowed portion 36 is produced in a range of $b \cdot \tan\theta$ due to the thickness b of the absorber pattern 35, the reflectivity of the pattern having a predetermined width is decreased. Since, in the relationship between the position of the pattern and the reflected radiation intensity shown in FIG. 8, the intensity of reflected radiation decreases at the boundary of the pattern while the intensity of reflected radiation exists on the outer side of the width T of the pattern, a problem takes place in imaging and replication of a pattern of a reflection pattern.

The necessary thickness of the absorber pattern 35 of the reflection mask shown in FIG. 8 is 0.2 µm when Cr is used for the absorber and is 0.1 µm when Au is used for the absorber, where the wavelength of an X-ray as incident radiation is 5 nm and the contrast is equal to or higher than 50. The thickness of any material used for the absorber must be increased as the wavelength of the vacuum ultraviolet radiation or X-radiation used for irradiation of the mask decreases.

FIGS. 9(a) and 9(b) show the positional relationship between an exposure optical system and a reflection mask 81 when a pattern 2222 of the reflection mask 31 is imaged and replicated by means of the exposure optical system described hereinabove with reference to FIG. 1. FIG. 9(a) is a sectional view of the mask, and FIG. 9(b) is a plan view. The intensity of reflected light decreases on a side face 361 of the pattern which extends in parallel to the sagittal direction.

SUMMARY OF THE INVENTION

Since the irradiation methods for a mask and the structures of reflection masks described above do not take the angle between the directions of side faces at boundaries of a pattern and incident radiation into consideration, portions at which the reflectivity is decreased occur in the proximity of the boundaries of the pattern as seen from FIGS. 4, 6, 8 and 9. As a ratio of a portion at which the reflectivity is decreased to a pattern width, when the width of the pattern is represented by T, the value of $a \cdot \tan\theta / T$ is defined for the reflection masks shown in FIGS. 4 and 6, and the value of (a•tanθ+b•tanθ)/T is defined for the reflection mask shown in FIG. 8.

If the value at the portion at which the reflectivity is decreased with respect to the pattern width becomes higher than about 0.1, the resolution of a pattern to be imaged or replicated becomes insufficient. For example, when the incidence angle θ is 10°, the width T of the pattern is 0.4 μm and the thickness a of the pattern is 0.4 μm, the value of a•tanθ/T is about 0.18, which presents an obstacle in the resolution of a pattern to be imaged or replicated.

This problem is a serious obstacle to resolution of a pattern in imaging or replication of a mask pattern (1) when the wavelength of vacuum ultraviolet radiation or X-rays to be used for irradiation of an optical element becomes short and the number of layers of a multilayer to be used is increased, and consequently the thickness a of the pattern must necessarily be great; (2) when the width T of a mask pattern to be imaged or replicated must be decreased as the refinement of a replication pattern proceeds; or (3) when the incidence angle θ of vacuum ultraviolet radiation or X-rays to be used for irradiation of an optical element is increased, because the value of a•tanθ/T or (a•tanθ+b•tanθ)/T increases.

The problem, described above, that the reflected radiation intensity is worsened at a boundary of a pattern is improved by the structure of an optical element constructed according to the teachings of the present invention.

According to a first aspect of the present invention, there is provided an optical element, which comprises a member having a predetermined pattern profile and provided on a substrate of the optical element, the member being made of a material capable of reflecting vacuum ultraviolet radiation or X-radiation which is incident to the member, the member being formed such that the reflectivity from the member with respect to the incident radiation is relatively higher than the reflectivity from a portion of the substrate at which the member is not provided with respect to the incident radiation at the portion of the substrate on which the member is not provided, the member having an area in which, when the incident radiation introduced into the member and having a finite incidence angle with respect to the direction of a normal line to the surface of the member is reflected by the member, the reflectivity with respect to the incident radiation introduced to the member in a section of the member in the direction of the normal line has a substantially maximum value (here, the "substantially maximum value" signifies "to intend to assume a maximum value", and the terminology "substantially" similarly applies in the following description) and another area in which the reflectivity has a value smaller than the substantially maximum value, and the section of the member having a sectional shape constructed such that the ratio of the area in which the reflectivity has a value smaller than the substantially maximum value to the entire area of the member may be smaller than that of an alternative member, wherein the sectional shape is a substantially rectangular shape.

According to a second aspect of the present invention, there is provided an optical element, which comprises a member having a predetermined thickness and a predetermined pattern profile and provided on a substrate of the optical element, the member being made of a material capable of reflecting vacuum ultraviolet radiation or X-radiation which is incident to the member, the member being formed such that the reflectivity with respect to the incident radiation introduced to the member is relatively higher than the reflectivity of reflected radiation from a portion of the substrate at which the member is not provided with respect to the incident radiation introduced into the portion of the substrate on which the member is not provided, the member being constructed such that part of the incident radiation is introduced into a first side face of the member and part of the reflected radiation emerges from a second side face of the member, and the member being disposed not at a location on the substrate of the member at which the total radiation amount of the reflected radiation emerging from the second side face of the member presents its maximum value, but rather at a position on the substrate at which the total radiation amount is smaller than the maximum value.

According to a third aspect of the present invention, there is provided an optical element, which comprises a member having a predetermined thickness and a predetermined pattern profile and provided on a substrate of the optical element, the member being made of a material capable of reflecting vacuum ultraviolet radiation or X-radiation which is incident to the member, the member being formed such that the reflectivity of radiation reflected from the member is relatively higher than the reflectivity of radiation reflected from a portion of the substrate at which the member is not provided, the member being constructed such that part of the incident radiation is introduced to a first side face of the member and part of the reflected radiation of the incident radiation emerges from a second side face of the member, a plurality of the members being provided on the substrate such that they are spaced from one another, and the plurality of members being individually disposed not at locations on the substrate at which the total amounts of the reflected radiation emerging from the second side faces of all of the plurality of members substantially present their maximum values, but rather at positions on the substrate at which the total radiation amounts are smaller than the maximum values.

According to a fourth aspect of the present invention, there is provided a projection exposure apparatus, which comprises an exposure source (89) for irradiating an optical element (81), an imaging optical system (95) for projecting radiation from the optical element (81) to a subject exposure member (82), and a member having a predetermined thickness and a predetermined pattern profile and provided on a substrate of the optical element, the member being made of a material capable of reflecting vacuum ultraviolet radiation or X-radiation which is incident to the member, the member being formed such that the reflectivity of the member with respect to the incident radiation is relatively higher than the reflectivity of radiation reflected from a portion of the substrate at which the member is not provided, the member having an area in which, when the incident radiation having a finite incidence angle with respect to the direction of a normal line to the surface of the member is reflected by the member, the reflectivity of the member in a section of the member in the direction of the normal line has a substantially maximum value, and another area in which the reflectivity has a value smaller than the substantially maximum value, and the section of the member having a sectional shape constructed such that the ratio of the area in which the reflectivity has a value smaller than the substantially maximum value to the entire area of the member may be smaller than that of an alternative member having a corresponding sectional shape that is substantially rectangular.

According to a fifth aspect of the present invention, there is provided a projection exposure apparatus, which comprises an exposure source (89) for irradiating an optical element (81), an imaging optical system (95) for projecting reflected radiation from the optical element (81) to a subject exposure member (82), and a member having a predetermined thickness and a predetermined pattern profile and provided on a substrate of the optical element, the member being made of a material capable of reflecting vacuum ultraviolet radiation or X-radiation which is incident to the member, the member being formed such that the reflectivity of radiation reflected from the member is relatively higher than the reflectivity of radiation reflected from a portion of the substrate at which the member is not provided, the member being constructed such that part of the incident radiation is introduced to a first side face of the member, and part of the reflected radiation emerges from a second side face of the member, and the member being disposed not at a location on the substrate of the member at which the total amount of the reflected radiation emerging from the second side face of the member presents its maximum value, but rather at a position on the substrate at which the total radiation amount is smaller than the maximum value.

According to a sixth aspect of the present invention, there is provided a projection exposure apparatus, which comprises an exposure source (89) for irradiating an optical element (81), an imaging optical system (95) for projecting reflected radiation from the optical element (81) to a subject exposure member (82), and a member having a predetermined thickness and a predetermined pattern profile and provided on a substrate of the optical element, the member being made of a material capable of reflecting vacuum ultraviolet radiation or X-radiation which is incident to the member, the member being formed such that the reflectivity of radiation from the member with respect to the incident radiation is relatively higher than the reflectivity of radiation from a portion of the substrate at which the member is not provided, the member being constructed such that part of the incident radiation is introduced to a first side face of the member and part of the reflected radiation emerges from a second side face of the member, a plurality of the members being provided on the substrate such that they are spaced from one another, and the plurality of members being individually disposed not at locations on the substrate at which the total radiation amounts of the reflected radiation emerging from the second side faces of all of the plurality of members substantially present their maximum values, but rather at positions on the substrate at which the total radiation amounts are smaller than the maximum values.

BRIEF DESCRIPTION OF THE DRAWINGS

FIGS. 5(a) and 5(b) are schematic views showing an example of a second conventional reflection mask construction;

FIG. 6 is a diagrammatic view showing the reflection mask of FIG. 5 and a reflected radiation intensity achieved with the reflection mask;

DETAILED DESCRIPTION OF THE PREFERRED EMBODIMENTS

Figure 10:
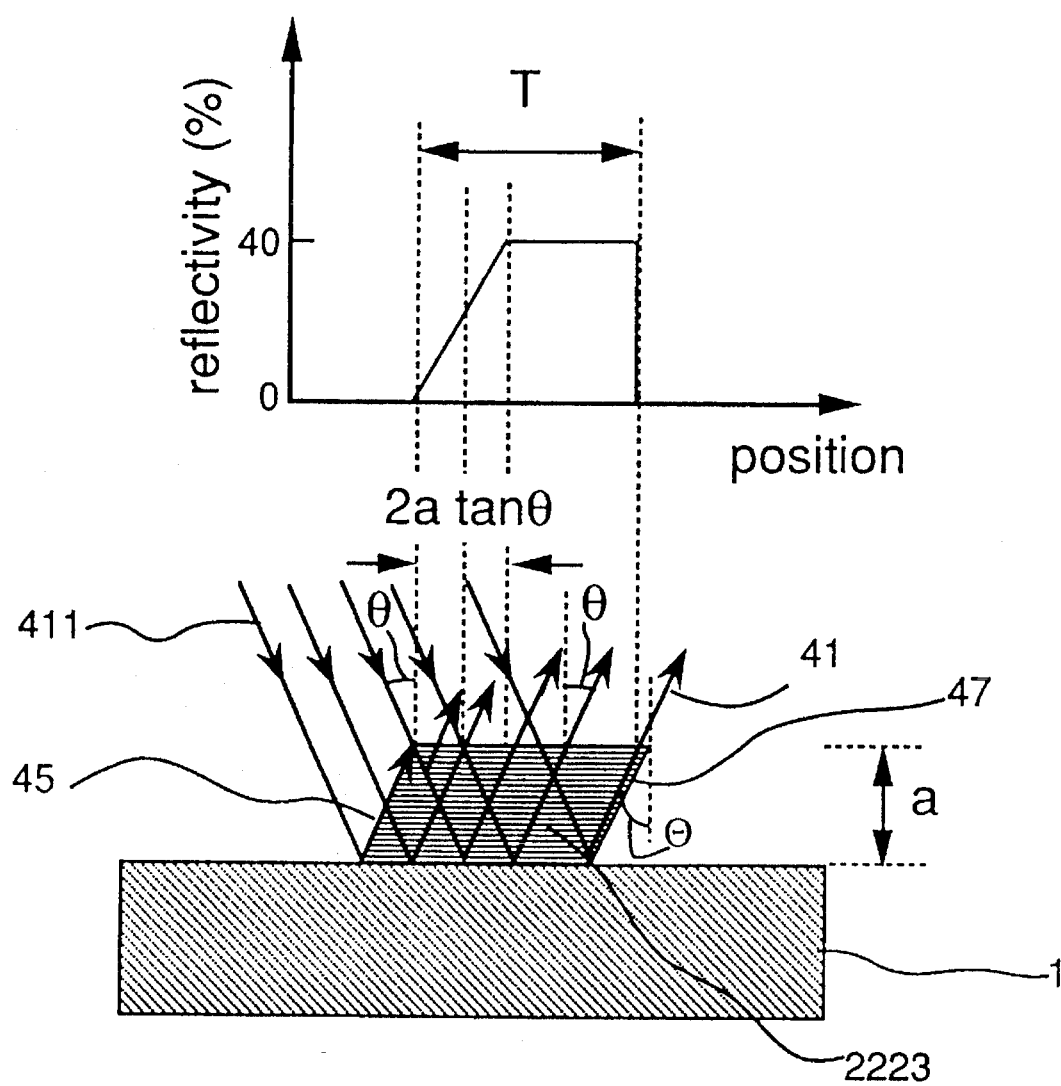
FIG. 10 is a diagrammatic view showing a first reflection mask which is an example of an optical element according to the present invention and a reflected radiation intensity achieved with the first reflection mask.

FIG. 10 shows a sectional structure of a reflection mask which is an example of an optical element of the present invention, and the relationship between the position of a pattern 22 formed from a multilayer, which is a region having a high reflectivity, and the reflected radiation intensity of incident radiation when vacuum ultraviolet radiation or X-radiation 411 is introduced at an incidence angle $\theta$ ($\theta>0°$; this applies similarly in the following description) to the reflection mask.

Here, since a reflection optical system is employed for an exposure optical system, preferably the wavelength of the vacuum ultraviolet radiation or X-rays 411 is equal to or higher than about 3 nm but equal to or lower than 150 nm.

When the direction in which the vacuum ultraviolet radiation or X-radiation 411 having the incidence angle $\theta$ is regularly reflected from the pattern 22 formed from a multilayer is parallel to the direction of a right-hand side boundary 47 of the pattern 22 as seen from FIG. 10, since reflected radiation does not escape from the outer side of the right-hand side boundary 47 of the pattern 22, the reflected radiation intensity exhibits a rectangular distribution at the right-hand side boundary 47 of the pattern 22. Where the width of the pattern is represented by T, the thickness by a, the angle of regular reflection by $\theta$ and the angle between a normal line to the outermost surface of the pattern 2223 and the side face of the pattern by $\Theta$, preferably the angle $\Theta$ is determined so that the value of $a\bullet|\tan\theta-\tan\Theta|/T$ may range from 0 to 0.05. This is because, in order to allow resolution of a pattern substantially sufficiently, it is necessary that the region in which the intensity of reflected radiation is decreased be within 5 percent with respect to the pattern width T.

Figure 11:
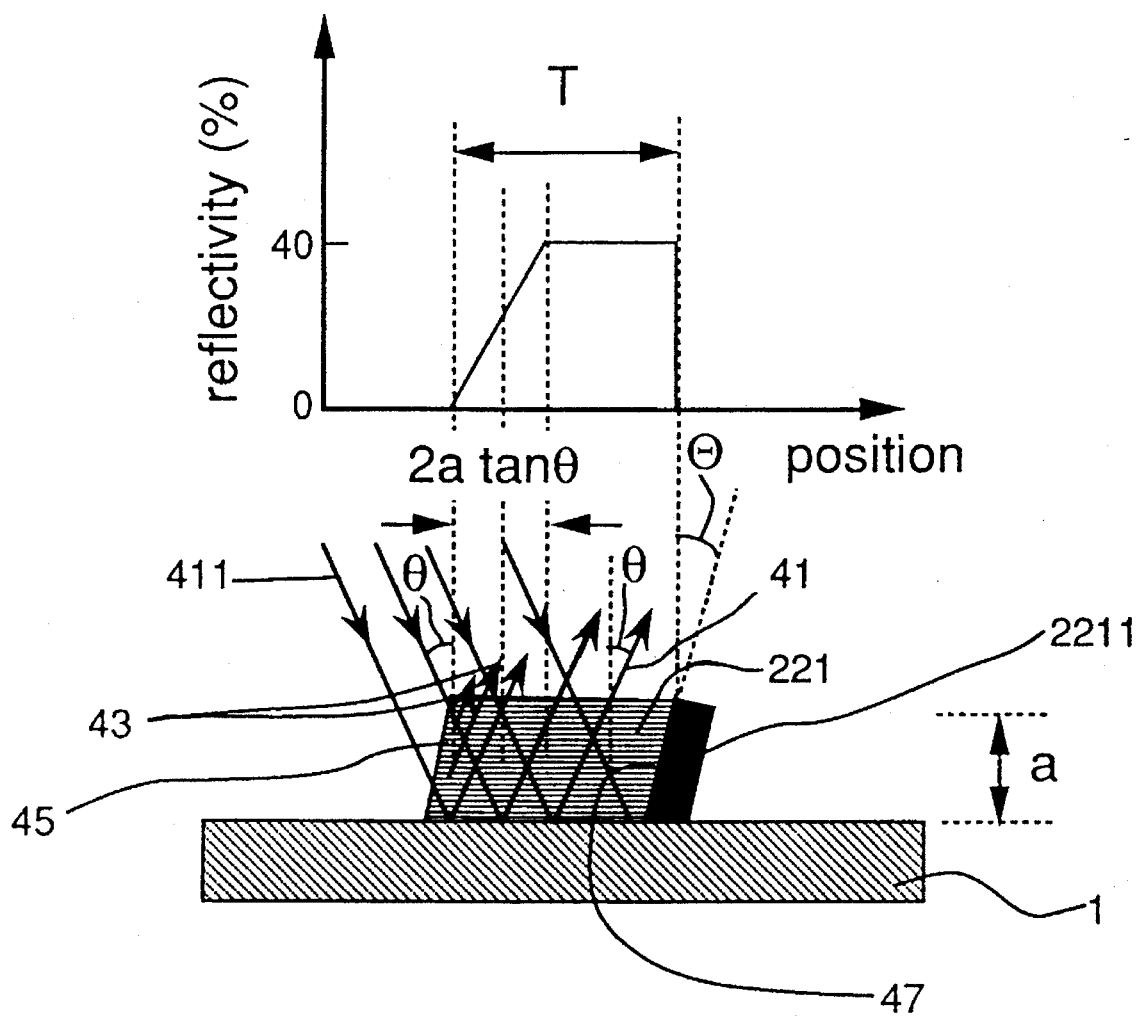
FIG. 11 is a diagrammatic view showing a second reflection mask which is an example of an optical element according to the present invention and a reflected radiation intensity achieved with the second reflection mask.

Another example of improvement in structure of an optical element is shown in FIG. 11. FIG. 11 shows a sectional structure of a reflection mask, which is another example of an optical element of the present invention, and the relationship between the position of a pattern 221 formed from a multilayer, which is a region having a high reflectivity, and the reflected radiation intensity of incident radiation when vacuum ultraviolet radiation or X-radiation 411 is introduced at an incidence angle $\theta$ to the reflection mask. The reflection mask of FIG. 11 is constructed such that, in order to reduce or prevent emergence of reflections from a right-hand side boundary 47 of the pattern 221 formed from a multilayer when the vacuum ultraviolet radiation or X-radiation 411 is introduced at the incidence angle $\theta$, an absorber 2211 is provided on the right-hand side boundary 47. Since no reflected radiation escapes from the outer side of the right-hand side boundary 47 of the pattern 221 formed from a multilayer, the reflected radiation intensity at the boundary of the pattern 221 is improved similarly as in the reflection mask shown in FIG. 10. The reflected radiation intensity of the reflection mask of FIG. 11 is improved, when the incidence angle $\theta$ and the angle $\Theta$ between a normal line to the outermost surface of the pattern 221 and a side face of the pattern 221 are different from each other or when the angle $\Theta$ does not meet the requirement of $0 \leq a|\tan\theta-\tan\Theta|/T<0.05$ after formation of the pattern 221, by applying the absorber 2211 so that reflected radiation may not escape from the right-hand side boundary 47 of the pattern 221. Consequently, the yield of accepted products of reflection masks as optical elements of the present invention is raised.

Figure 12:
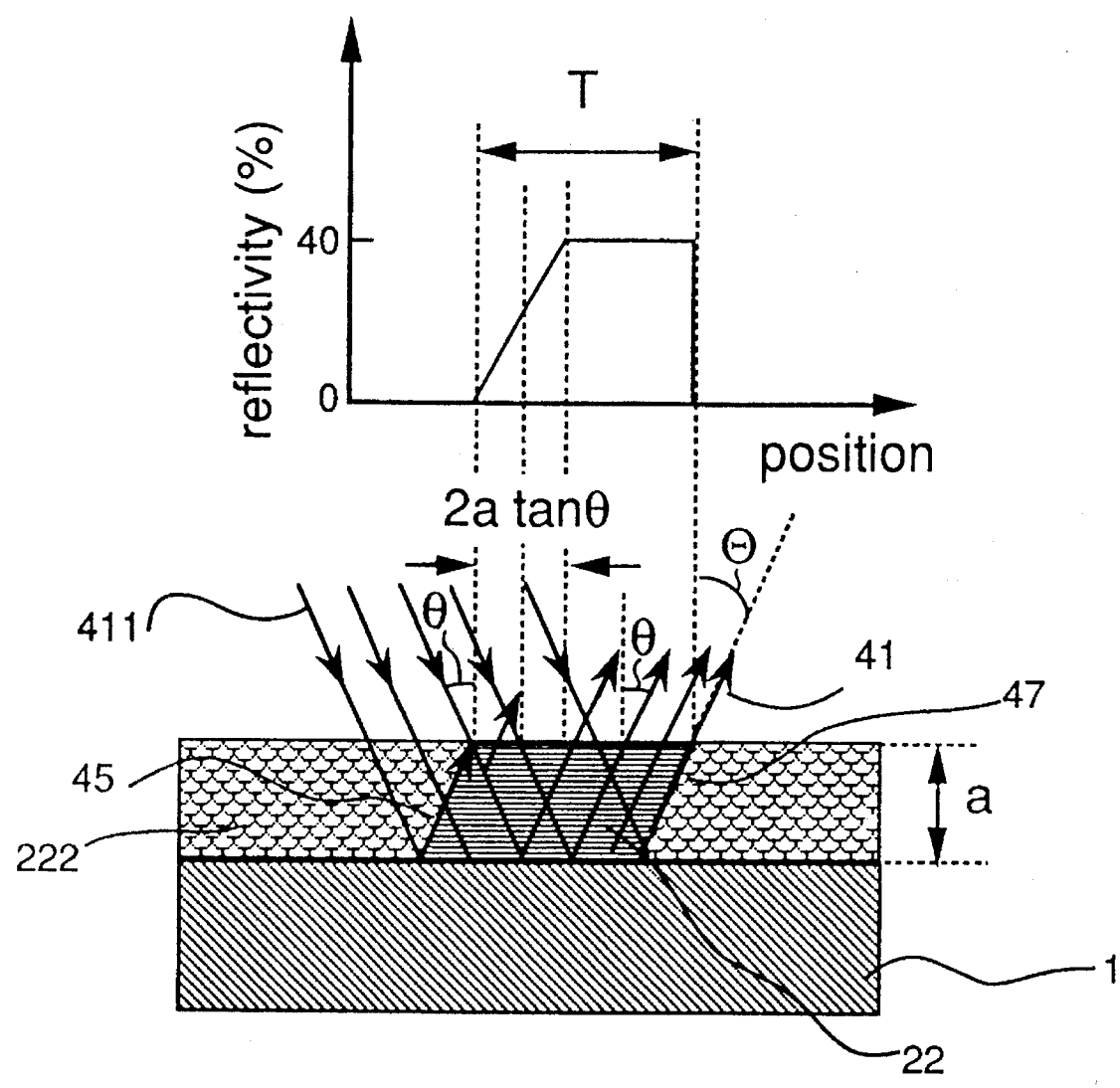
FIG. 12 is a diagrammatic view showing a third reflection mask which is an example of an optical element according to the present invention and a reflected radiation intensity achieved with the third reflection mask.

A further example is shown in FIG. 12. FIG. 12 shows a sectional structure of a reflection mask and the relationship between the position of a pattern 221 formed from a multilayer, which is a region having a high reflectivity, and the reflected radiation intensity of incident radiation when vacuum ultraviolet radiation or X-radiation 411 is introduced at an incidence angle $\theta$ to the reflection mask. An ion beam or a like beam is introduced at an angle $\Theta$ to the multilayer so that the angle $\Theta$ may be equal to an angle $\theta$ at which the vacuum ultraviolet radiation or X-radiation 411 is introduced into the reflection mask is regularly reflected to form a region 222 to which the ion beam has been introduced. Another region to which the ion beam has not been introduced makes a pattern 22 formed from a multilayer which is a region in which the reflectivity is high. The multilayer in the region 222 in which the ion beam has been introduced is free from steep interfaces between the at least two kinds of films forming the multilayer, and consequently, the reflectivity thereof is deceased remarkably. Since the region 222 into which the ion beam has been introduced is present on a right-hand side boundary 47 of the pattern 22 formed from a multilayer, reflected radiation does not likely escape from the outer side of the right-hand side boundary 47 of the pattern 22. Since the incidence angle of an ion beam or a like beam is easy to control, there is an advantage that the angle $\Theta$ of the pattern 22 of the mask formed from a multilayer can be controlled comparatively readily. Consequently, the yield of accepted products of reflection masks as optical elements of the present invention is raised.

Figure 13A:
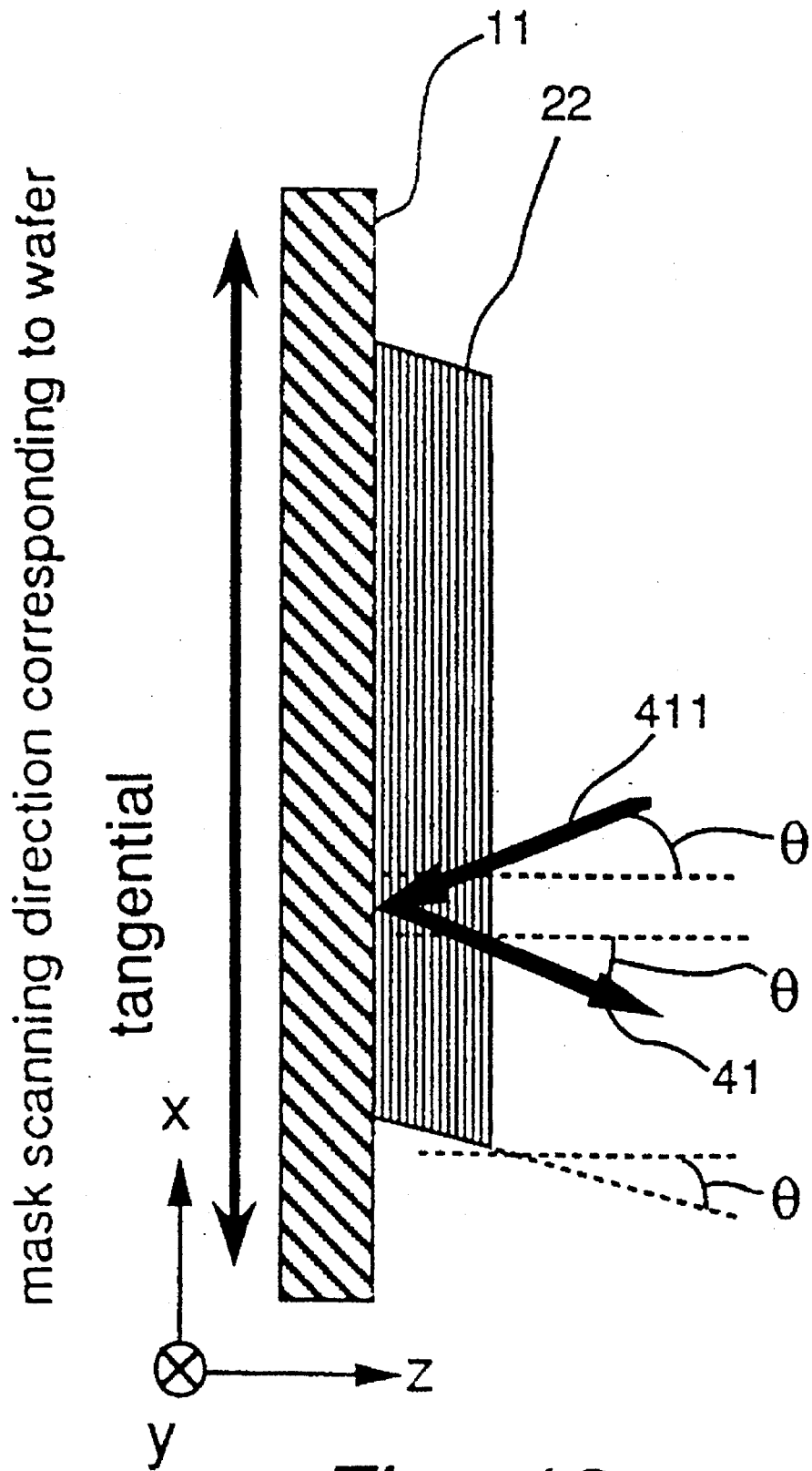
FIGS. 13(a) and 13(b) are schematic views illustrating an irradiation method using a reflection mask which is an example of an optical element according to the present invention.
Figure 13:
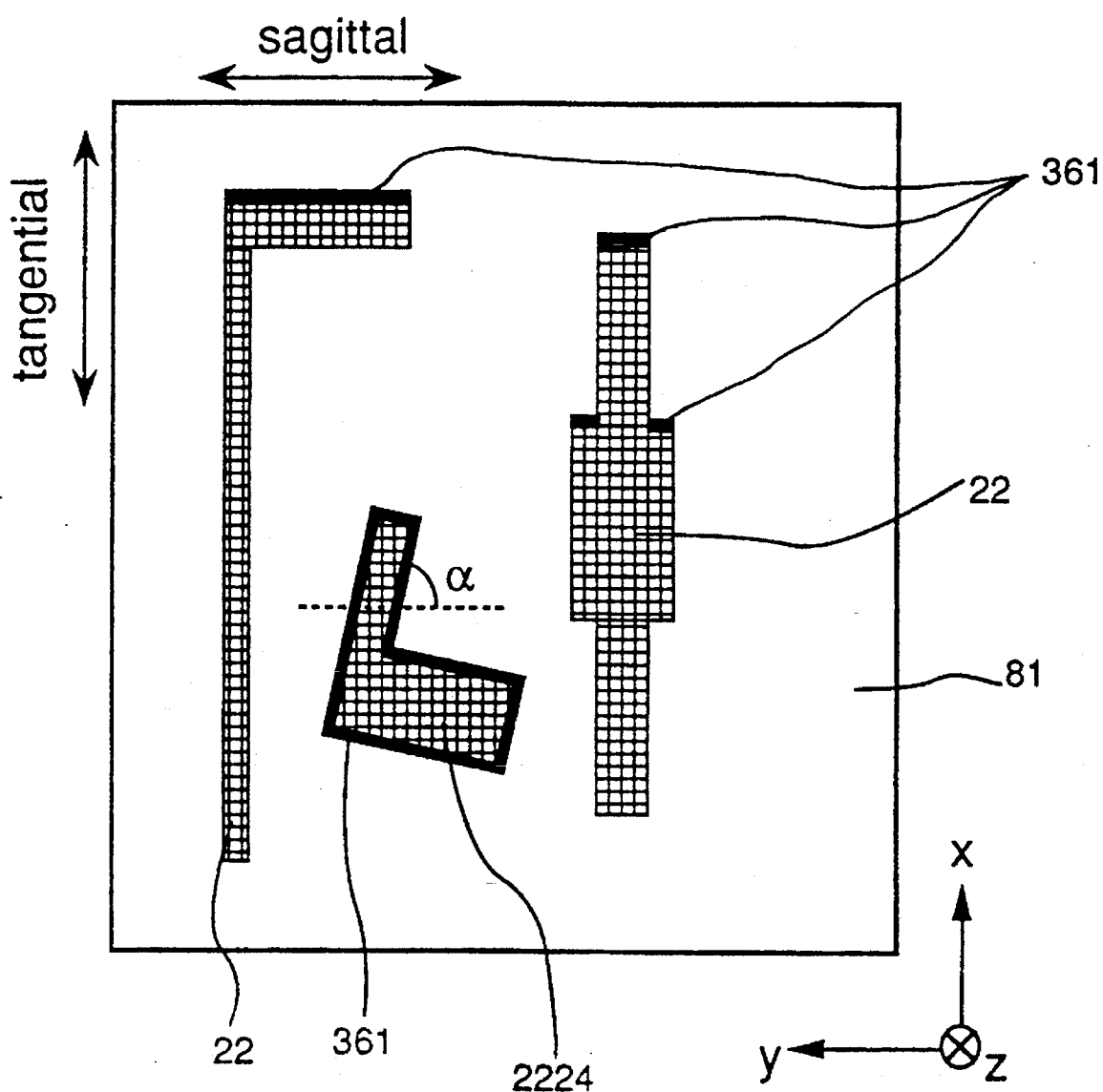
Figure 14A:
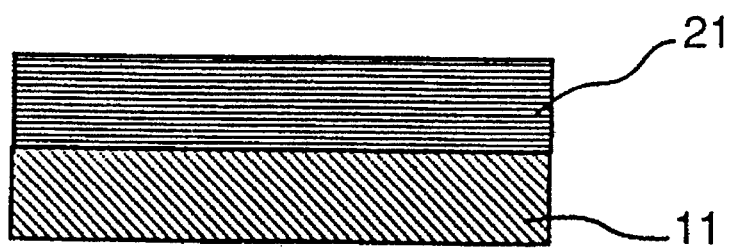
FIGS. 14(a) to 14(d) are schematic views showing different steps of a first manufacturing process for a reflection mask which is an example of an optical element according to the present invention.
Figure 14B:
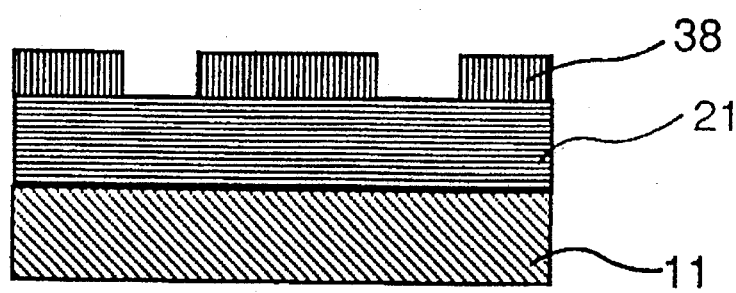
Figure 14C:
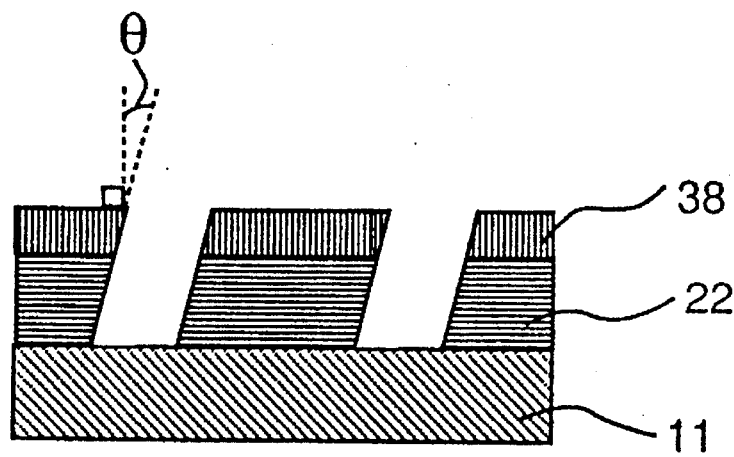
Figure 14D:
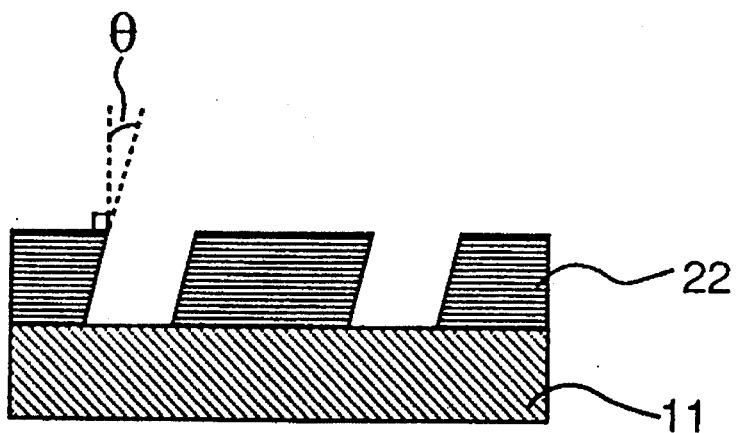

If the arrangement of the incidence angle $\theta$ and a pattern of a reflection mask 81 is taken into consideration as shown in FIG. 13, then worsening of the reflected radiation intensity of an image pattern formed on a plane of a wafer or the like can be greatly decreased. Patterns 22 of a reflection mask 81 are disposed so that, when the reflection mask 81 on which at least one kind of predetermined pattern is carried is exposed to or irradiated by vacuum ultraviolet radiation or X-rays 411 at an incidence angle $\theta$, shadows 361 which are formed (that is, side face portions 361 of the patterns 22 at which the reflection ratio is decreased) may be minimized. Consequently, the worsening of the reflected radiation intensity of an image pattern formed on the plane of the wafer or the like can be greatly reduced.

Further, the worsening of the reflected radiation intensity of an image pattern formed on the plane of the wafer or the like can be reduced by disposing the patterns 22 of the reflection mask 81 so that, in the positional relationship between the reflection mask 81 and the incident radiation 411, the side face portions 361 which make longitudinal shadows of those of the at least one kind of patterns 22 of the reflection mask 81 which have comparatively small line widths may be minimized as shogun in FIG. 13. According to the present method, since a pattern which has a comparatively small width and is liable to be worsened in resolution by a shadow does not make a shadow, the resolution of the small width pattern is not worsened at all.

Furthermore, the worsening of the reflected radiation intensity of an image pattern formed on the plane of the wafer or the like can be reduced by disposing the patterns 22 of the reflection mask 81 so that those of the at least one kind of patterns 22 which have comparatively small line widths may coincide with the tangential direction of the incident radiation 411 as much as possible as shown in FIG. 13 so as to minimize side face portions which make the shadows 361.

Figure 1:
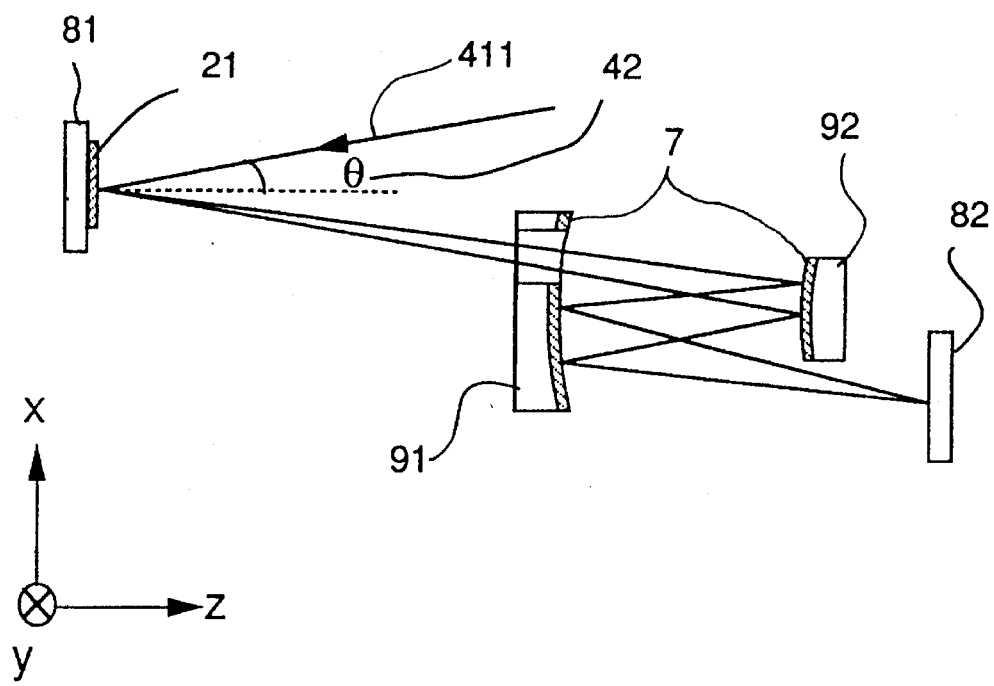
FIG. 1 is a diagrammatic view showing an optical system employed in a conventional reduction X-ray projection exposure method.
Figure 2:
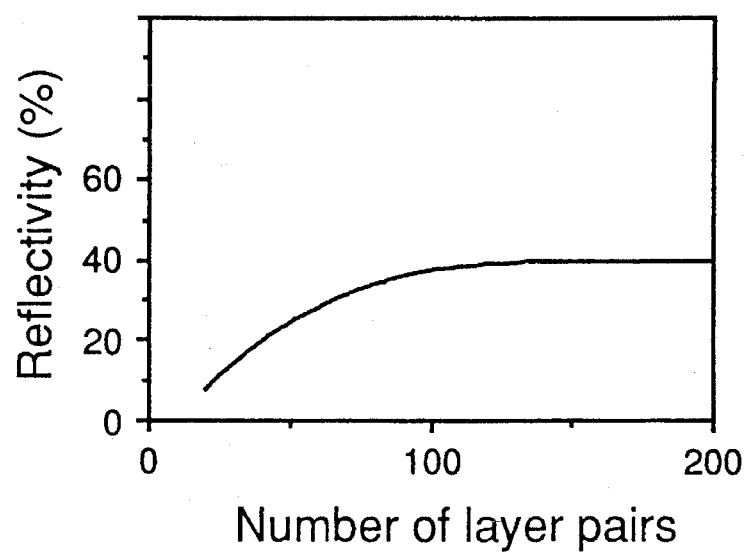
FIG. 2 is a diagram showing the relationship between the number of layers of a multilayer and the reflectivity.
Figure 3:
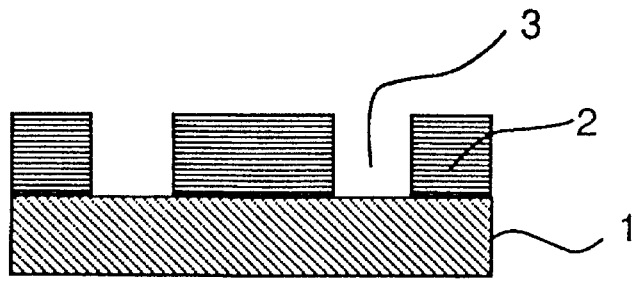
FIG. 3 is a schematic view showing an example of a first conventional reflection mask construction.
Figure 4:
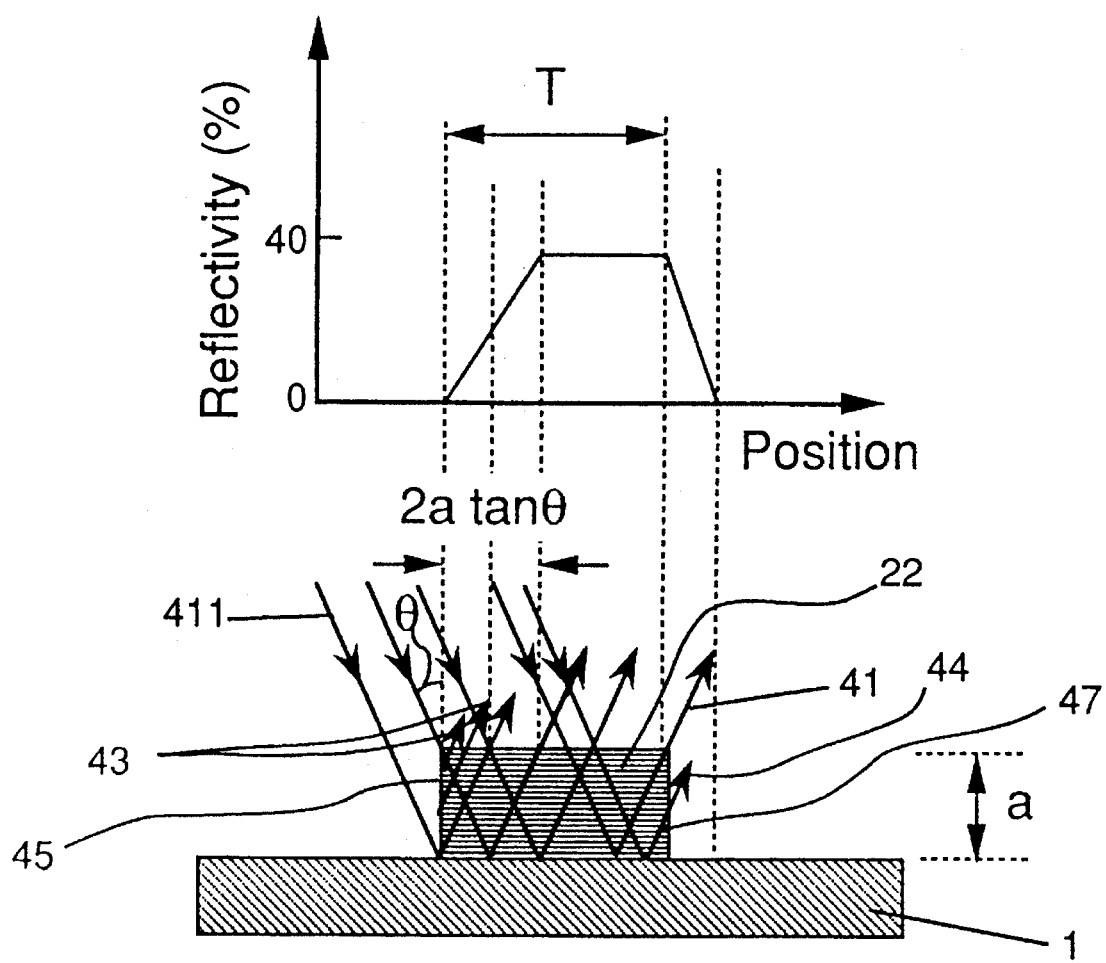
FIG. 4 is a diagrammatic view showing the reflection mask of FIG. 3 and a reflected radiation intensity achieved with the reflection mask.
Figure 7:
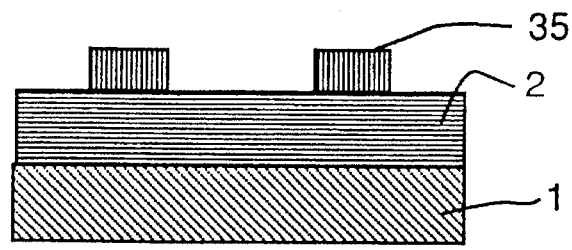
FIG. 7 is a schematic view showing an example of a third conventional reflection mask construction.
Figure 8:
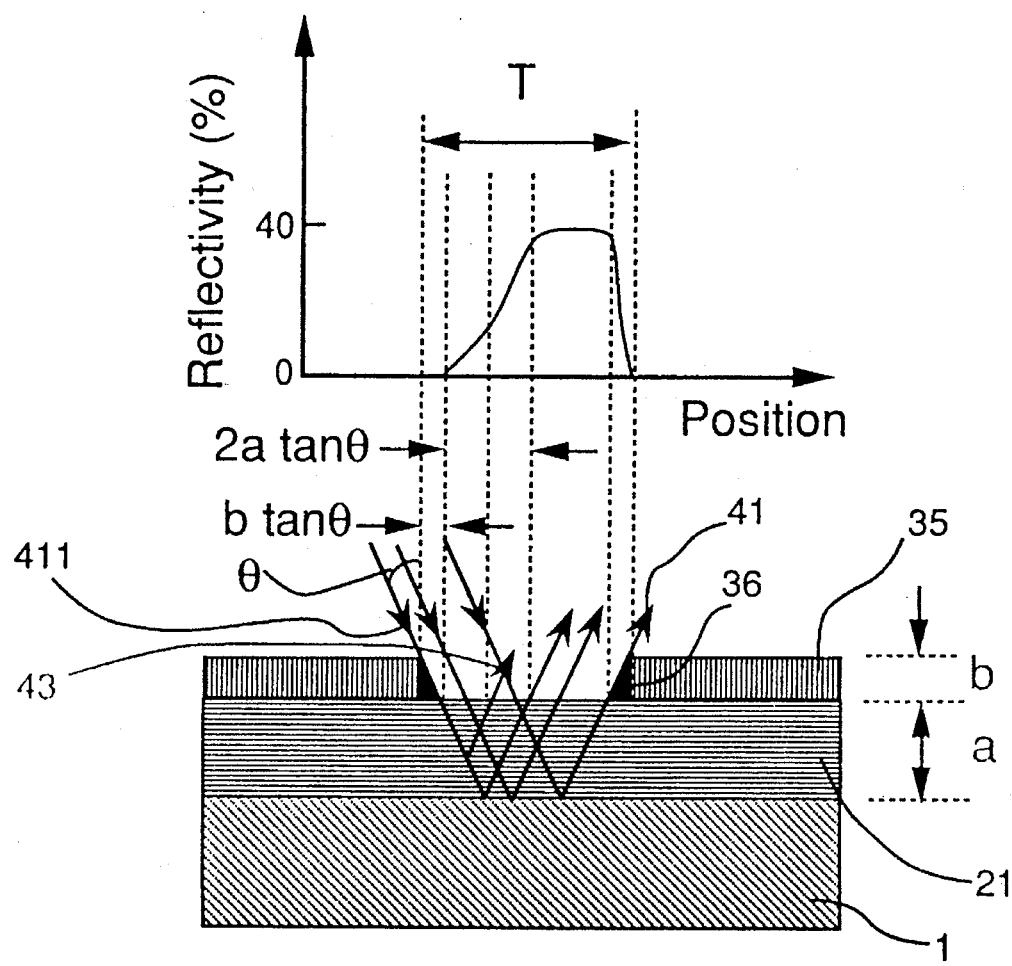
FIG. 8 is a diagrammatic view showing the reflection mask of FIG. 7 and a reflected radiation intensity achieved with the reflection mask.
Figure 9A:
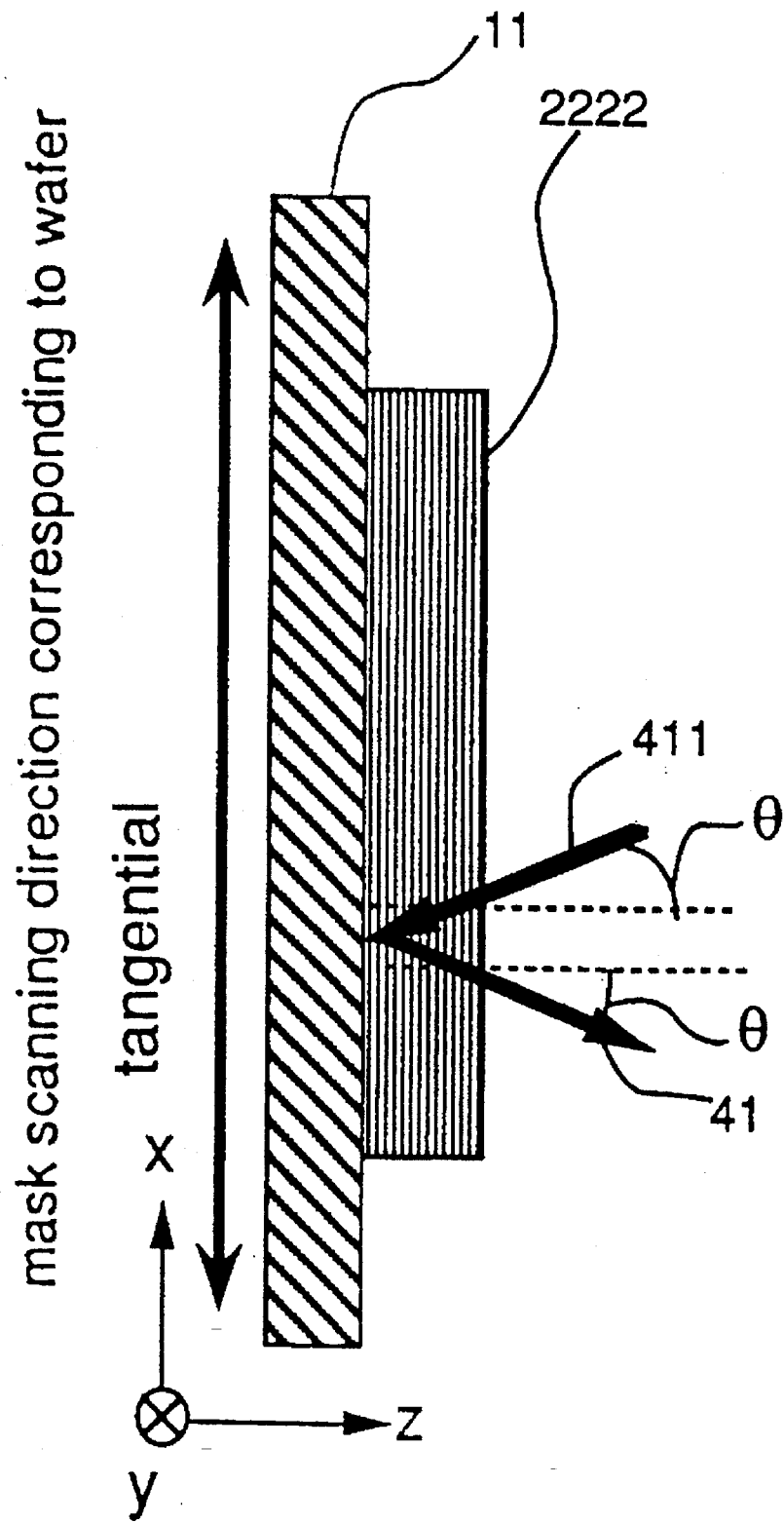
FIGS. 9(a) and 9(b) are schematic views illustrating an irradiation method for a conventional reflection mask.
Figure 9B:
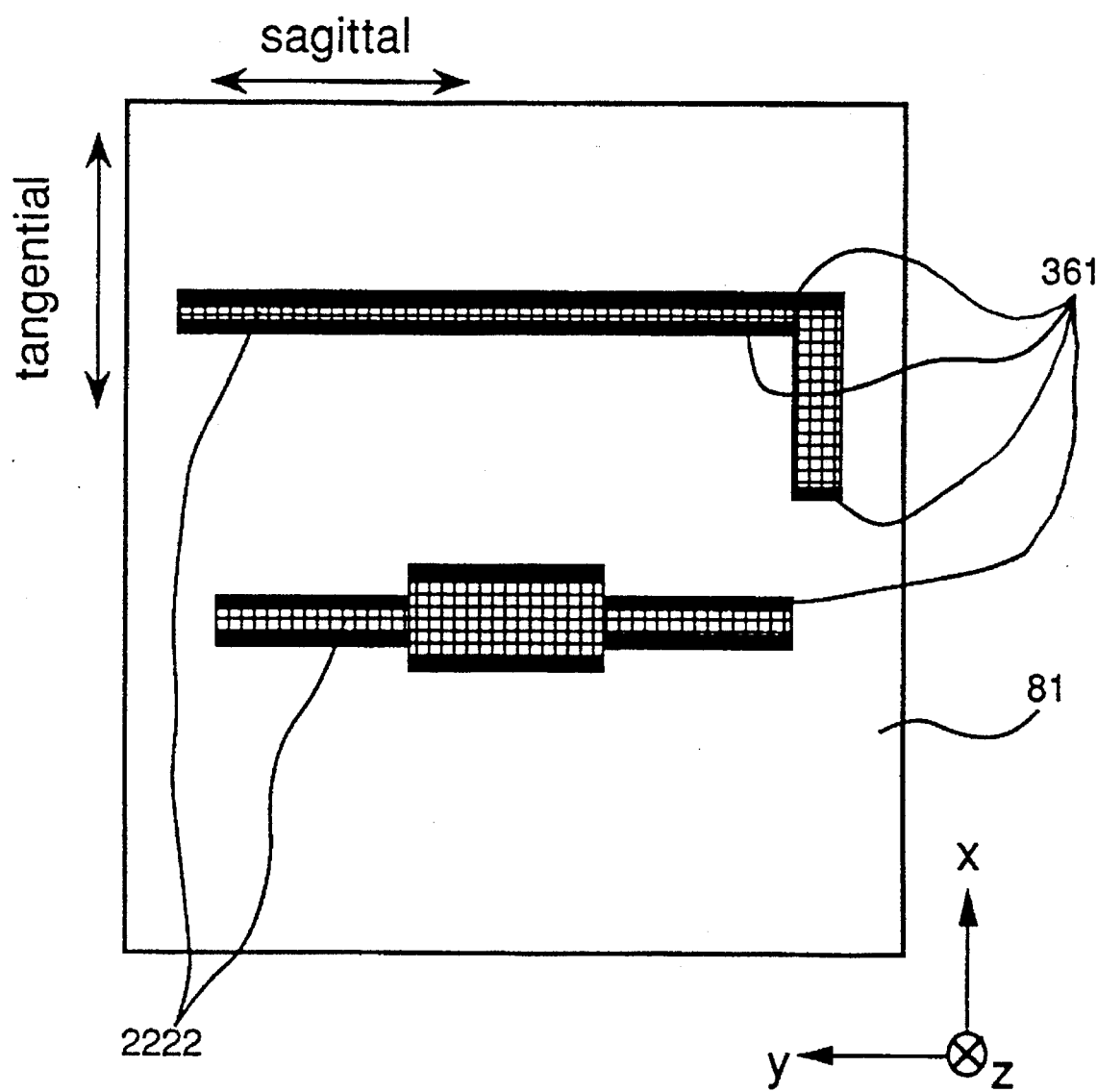

Further, when the reflection mask 81 is scanned in the tangential direction in synchronism with a wafer in order to expand the irradiation area of the reflection mask 81 and the exposure area of the wafer with such an optical system as described hereinabove with reference to FIG. 1, vibrations are sometimes produced in the synchronous scanning direction so that worsening of the reflected radiation intensity of an image pattern is caused. The resolution of an image pattern is worsened by the synchronous scanning due to synergetic effects of the worsening of the reflected radiation intensity of an image pattern formed on the plane of the wafer or the like and worsening of the reflected radiation intensity of an image pattern by the shadows. When the incident radiation 411 is introduced to the reflection mask 81 in FIG. 13 to replicate the patterns 22 onto a wafer (not shown) serving as a substrate, the patterns 22 on the reflection mask 81 are disposed so that the direction in which the reflection mask 81 and the wafer are scanned synchronously, and the direction in which side portions which make the longitudinal shadows 361 of those of the at least one kind of patterns 22 on the reflection mask 81 which have comparatively small line widths are minimized, may coincide with each other in order to greatly reduce the worsening of the reflected radiation intensity of an image pattern on the wafer.

A pattern 2224 which does not extend in parallel to any of the tangential and sagittal directions in FIG. 13 makes shadows 361 by an amount defined by the cosine of the angle $\alpha$ of the pattern with respect to the sagittal direction, that is cos $\alpha$. In order to minimize the shadows 361, preferably attention is paid to the arrangement of the pattern 2224 on the reflection mask 81 so that the angle $\alpha$ of the pattern having a comparatively small line width with respect to the sagittal direction may approach 90°.

Further, if a pattern of an optical element to be replicated or imaged is designed so that the width thereof may be adjusted in advance so as to correct the worsening of the reflectivity which takes place at a side face portion of a pattern 22 or to correct the escape of reflected radiation from the side face of the pattern, then the difference between a designed value of a width of the pattern and a width of a pattern replicated or actually imaged is improved. Where the reduction ratio is represented by r and the width of the pattern of the reflection mask by T in FIG. 10, ideally the width of an image pattern on a wafer is given by T•r. Actually, since worsening of the reflected radiation intensity of an image pattern on a wafer is caused by worsening of the reflectivity at the location spaced by the distance 2a•tan$\theta$ from the left-hand side face 45 of the pattern 22, the width of the image pattern on the wafer is given by (T−$\Delta$T)•r. If the width of the pattern 22 of the reflection mask is set in advance to T+$\Delta$T to effect correction, then the image pattern formed on the wafer will have the width T•r. Accordingly, the difference between a designed value of the width of a pattern of a reflection mask and a width of an image pattern replicated or actually imaged is eliminated.

Example 1

An example of a process of manufacturing a reflection X-ray mask which is an example of an optical element of the present invention will be described. FIGS. 14(a) to 14(d) show different steps of the manufacturing process. Nickel (Ni) films each having a thickness of 1.27 nm and carbon (c) films each having a thickness of 1,27 m are formed alternately on a silicon or SiC substrate 11 by a magnetron sputtering method until a total of 160 layers of each of the two films are reached to make up a multilayer 21 (FIG. 14(a)). A resist is applied to the upper surface of the multilayer 21, and a resist pattern 38 is formed (FIG. 14(b)) by electron beam lithography, which is but one possible pattern forming method. Then, the multilayer 21 is removed by reactive ion etching using the resist pattern 38 as a mask (FIG. 14(c)), and thereafter, the resist pattern is removed to form a multilayer pattern 22 (FIG. 14(d)).

Figure 15:
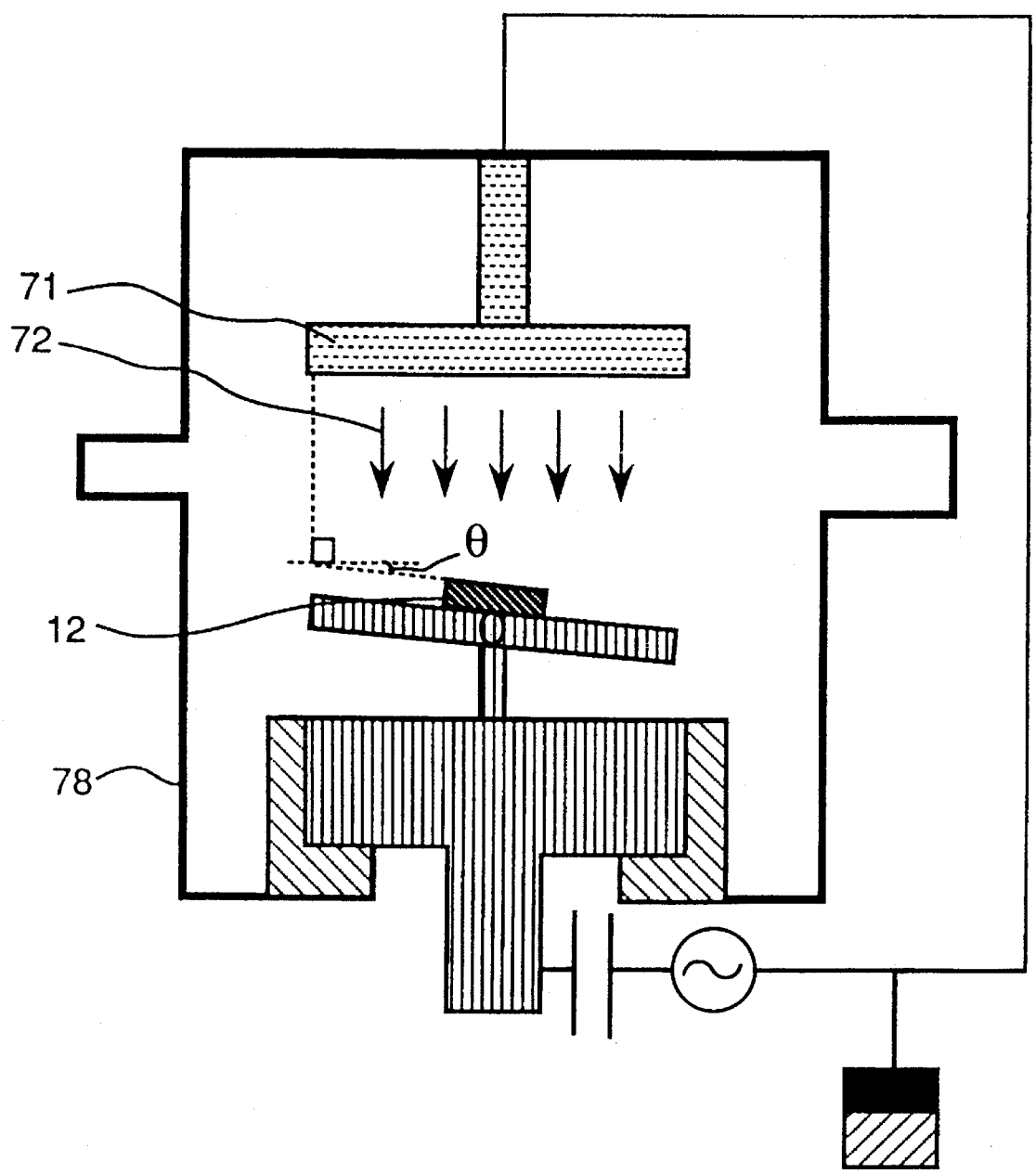
FIG. 15 is a schematic view showing an example of a manufacturing apparatus for a reflection mask according to the present invention.
Figure 16A:
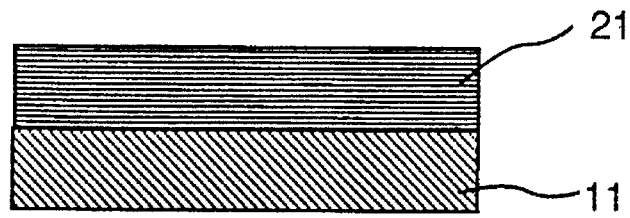
FIGS. 16(a) to 16(e) are schematic views showing different steps of a second manufacturing process for a reflection mask which is an example of an optical element according to the present invention.
Figure 16B:
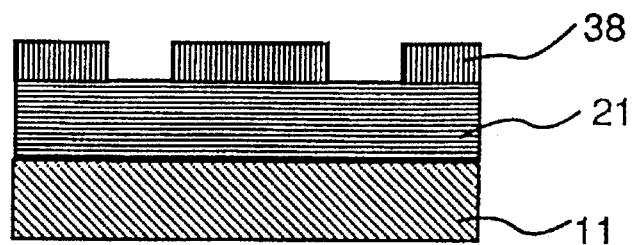
Figure 16C:
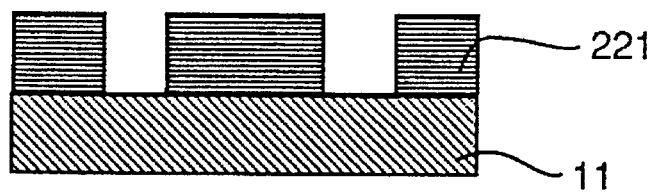
Figure 16D:
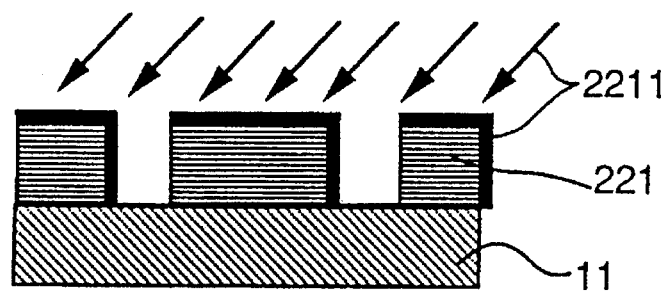
Figure 16E:
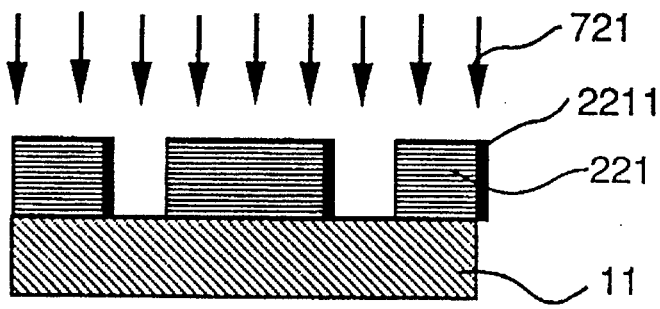

In this instance, oblique etching is performed by disposing a Si wafer 12 which is a specimen and a substrate such that, as shown in FIG. 15, the lower face of an opposing electrode 71 of an etching apparatus 78 and the plane of the Si wafer 12 define therebetween an angle $\theta$ equal to the angle of incident radiation which is used for irradiation or exposure of a reflection mask. Preferably, the pressure of gas used is made as low as possible and the directivity of a reactive ion beam 72 for etching is strengthened. Subsequently, the resist is removed by an oxygen plasma asher. A reflection mask is thus produced which carries thereon the pattern 22 which makes an angle $\theta$ with respect to a normal line to the outermost surface of the pattern. Alternatively, oblique etching may be performed by reactive ion etching by means of an ion beam employing electron cyclotron resonance.

Example 2

Another embodiment of a reflection X-ray mask which is an example of an optical element of the present invention will be described. FIGS. 16(a) to 16(e) show different steps of the manufacturing process of the reflection X-ray mask. As in Example 1 described above, nickel (Ni) films each having a thickness of 1.27 nm and carbon (C) films each having a thickness of 1.27 nm are formed alternately on a silicon or SiC substrate 11 by a magnetron sputtering method until a total of 160 layers of each of the two layers are reached to make up a multilayer 21 (FIG. 16(a)). A resist is then applied to the upper surface of the multilayer 21, and a resist pattern 38 is formed (FIG. 16(b)) by optical lithography, for example. Then, the multilayer 21 is removed by reactive ion etching using the resist pattern 38 as a mask to form a multilayer pattern 221 (FIG. 16(c)). Thereafter, Ta 2211 is vapor deposited to a thickness of 0.1 μm in an oblique direction (FIG. 16(d)), and then the Ta on the surface of the multilayer pattern 221 is removed in a vertical direction by ion milling 721 to form a reflection X-ray mask (FIG. 16(e)) having a structure wherein reflected radiation is not able to escape from a side face of the pattern.

Example 3

Figure 17A:
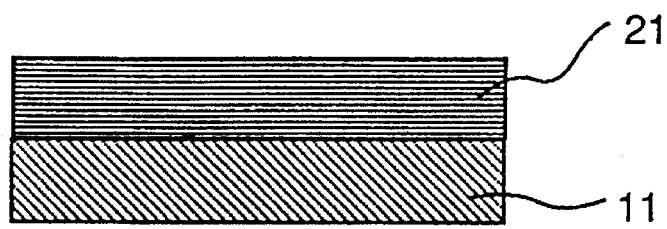
FIGS. 17(a) and 17(b) are schematic views showing different steps of a third manufacturing process for a reflection mask which is an example of an optical element according to the present invention.
Figure 17B:
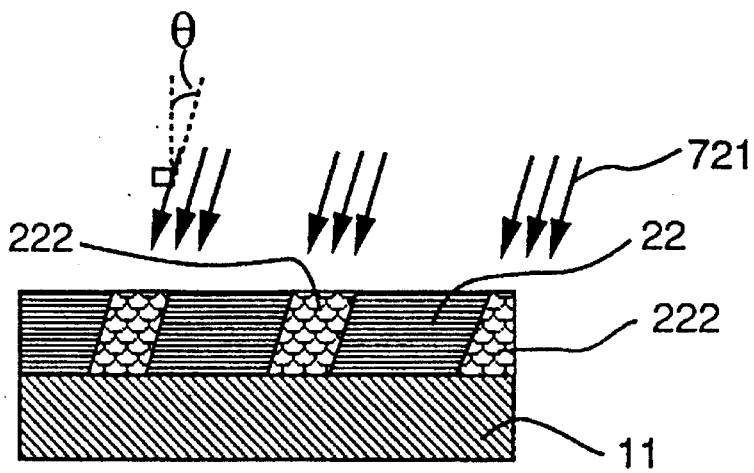

A further embodiment of a reflection X-ray mask which is an example of an optical element of the present invention will be described. FIGS. 17(a) and 17(b) show different steps of the manufacturing process of the reflection X-ray mask. As in Example 1 described above, nickel (Ni) films each having a thickness of 1.27 nm and carbon (C) films each having a thickness of 1.27 nm are formed alternately on a silicon or SiC substrate 11 by a magnetron sputtering method until a total of 160 layers of each of the two layers are reached to make up a multilayer 21 (FIG. 17(a)). Then, a focus ion beam 721 formed from Be ions and having a high directivity is introduced obliquely into the multilayer 21 at an angle $\theta$ equal to the angle at which incident radiation for exposure of a reflection mask is reflected regularly to form a desired pattern 222. In this instance, the kind of incidence ions and the incidence energy of the ion beam 721 must necessarily be selected suitably in accordance with the thickness of the multilayer 21. The element of the incidence ions may be Be, N, O, C, Ar, Kr, P, Xe, F, Cl, B or some other suitable elements. The steepness of interfaces between the Ni films and the C films is removed from the multilayer in a region 222 to which the ion beam 721 has been introduced. Consequently, a reflection X-ray mask is formed which has a structure wherein reflected radiation is not able to escape from a side face of the pattern (FIG. 17(b)).

Example 4

Figure 18:
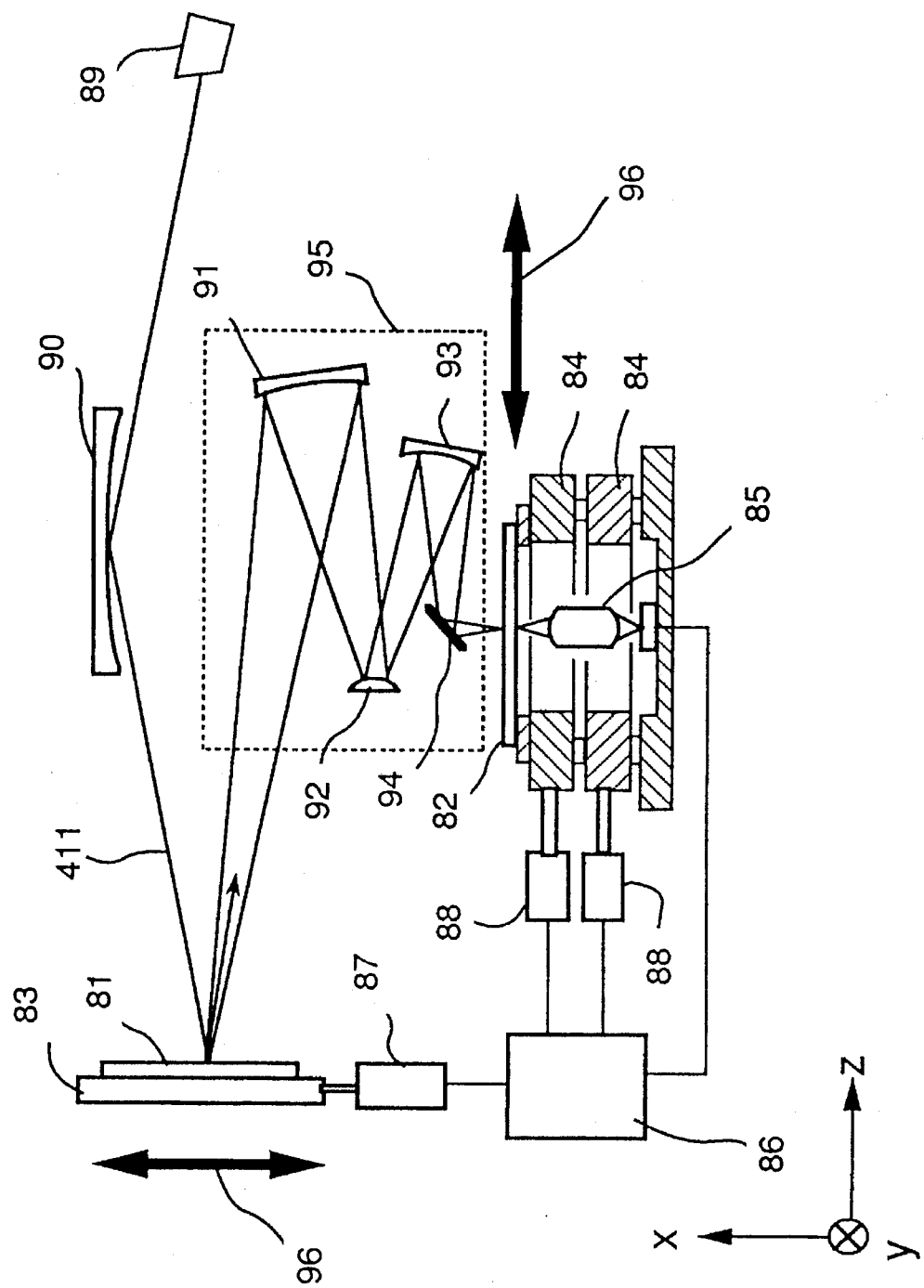
FIG. 18 is a diagrammatic view showing an embodiment of a projection exposure apparatus according to the present invention.

A reflection mask 81 formed according to any one of the Examples 1 to 3 is loaded in position into an X-ray projection exposure apparatus shown in FIG. 18, and the pattern of the reflection mask 81 is replicated onto a wafer 82 which defines a plane. The reflection mask 81 and the wafer 82 on which an image pattern is to be formed are carried on a mask stage 83 and a wafer stage 84, respectively. First, the relative positions of the reflection mask 81 and the wafer 82 are detected using an alignment apparatus 85, and they are positioned relative to each other by way of driving apparatus 87 and 88, respectively, under the control of a control apparatus 86. X-rays 411 radiated from an X-ray source 89 are collimated by a reflecting mirror 90 and illuminate a ring field on the reflection mask 81. Here, the arrangement of the pattern of the reflection mask 81 is set so that side faces in a lateral direction of those of the multilayer patterns on the reflection mask 81 which have comparatively small widths, and the direction of the X-rays 411 reflected regularly from the multilayer patterns, may extend in parallel to each other. In particular, the positional relationship between the reflection mask 81 and the incident X-rays 411 is set so that, as shown in FIG. 13, the lateral direction of the pattern 22 having the comparatively small width may coincide with the sagittal direction of the incident X-rays 411 while the longitudinal direction of the pattern having the comparatively small width coincides with the tangential direction of the incident X-rays 411.

The X-rays reflected from the reflection mask 81 have a wavelength near 5 nm, and are imaged at a magnification of ⅕ on the wafer 82 by way of an imaging optical system 95 consisting of reflecting mirrors 91, 92, 93 and 94. Each of the reflecting mirrors 91, 92, 93 and 94 has a Ni/C multilayer similar to that of the reflection mask 81 vapor-deposited thereon. The cycle of each of the layers of the multilayer is adjusted so that it may coincide with the incidence angle to the corresponding optical system. The reflection mask 81 and the wafer 82 are synchronously scanned in the directions indicated by a double-sided arrow 96 in accordance with the magnification to replicate the pattern of the entire surface of the reflection mask 81 onto the wafer 82. By such a method, a pattern having a width of 0.05 µm can be obtained in a 30 nm square area on the wafer 82.

Example 5

As a multilayer for a reflection mask, rhodium (Rh) films each having a thickness of 1.8 nm and boron nitride (BN) films each having a thickness of 1.8 nm are alternately formed by a magnetron sputtering method until a total of 150 layers of each of the two films are reached to form a reflection X-ray mask similar to those of Examples 1, 2 and 3. Then, the reflection X-ray mask is exposed and illuminated using the X-ray projection exposure apparatus shown in FIG. 18 to image and replicate the pattern of the reflection mask onto a wafer. Each of the reflection mirrors 91, 92, 93 and 94 has a Rh/BN multilayer similar to that of the mask that is vapor-deposited thereon. The X-rays reflected from the mask have a wavelength near 7 nm. When imaging and replication are performed similarly as in Example 4, a pattern having a width of 0.07 µm can be obtained.

Example 6

As a multilayer for a reflection mask, molybdenum (Mo) films each having a thickness of 3.37 nm and silicon carbide (SIC) films each having a thickness of 3.37 nm are alternately formed by a magnetron sputtering method until a total of 50 layers of each of the two films are reached to form a reflection X-ray mask similar to those of Examples 1, 2 and 3. Then, the reflection X-ray mask is exposed and illuminated using the X-ray projection exposure apparatus shown in FIG. 18 to image and replicate the pattern of the reflection mask onto a wafer. Each of the reflection mirrors 91, 92, 93 and 94 has a Mo/SiC multilayer similar to that of the mask that is vapor-deposited thereon. The X-rays reflected from the mask have a wavelength near 13 nm. When imaging and replication are performed similarly as for Example 4, a pattern having a width of 0.1 µm can be obtained.

While, in the examples described above, only the cases wherein the material of a multilayer is Ni/C, Rh/BN and Mo/SiC are described, the present invention is not limited to such materials, but can be put into practice using any material from which a suitable multilayer can be formed, such as, for example, NiCr/C, Ni/V, Ni/Ti, W/C, Ru/C, Rh/C, Ru/BN, Rh/B$_4$C, RhRu/BN, Ru/B$_4$C, Mo/Si, Pd/BN, Ag/BN, Mo/SiN, Mo/B$_4$C, Mo/C, Ru/Be, Cu/C, Co/C, Fe/C or Mn/C.

Further, while only a reflection mask is described in the examples, the present invention is not limited to a reflection mask but can be applied to any optical element which has a refined pattern on a reflecting surface thereof such as a diffraction grating or a linear zone plate.

As is apparent from the foregoing description, according to the present invention, an optical element which is improved in reflected radiation intensity of an image pattern and can replicate or image a refined pattern, and a projection exposure apparatus employing the optical element, can be provided. Further, a refined pattern can be replicated onto a plane of an element such as a wafer since an image pattern which is improved in reflected radiation intensity can be imaged by way of an imaging optical system by irradiating the optical element of the present invention.

What is claimed is:

1. An optical element, comprising:

a substrate having a surface; and a reflective member having a predetermined thickness, said reflective member being provided on the substrate surface and including a material for reflecting one of vacuum ultraviolet radiation and X-radiation which is incident to said member, the reflectivity of said reflective member with respect to vacuum ultraviolet radiation and X-radiation being relatively higher than the reflectivity, with respect to vacuum ultraviolet radiation and X-radiation, of said substrate surface;

wherein said member includes a first portion having a first reflectivity to incident vacuum ultraviolet radiation and X-radiation introduced to said member at a finite incidence angle, and a second portion having a second reflectivity to incident vacuum ultraviolet radiation and X-radiation that is smaller than the first reflectivity.

2. An optical element according to claim 1, wherein said optical element is a reflection mask, a linear zone plate or a diffraction grating.

3. An optical element according to claim 1, wherein said reflective member has a cross-sectional shape that is substantially a parallelogram, the cross-section defining the cross-sectional shape being taken in the direction of a normal line to a surface of said member that is generally parallel to the substrate surface.

4. An optical element according to claim 3, wherein one pair of opposed parallel sides of the parallelogram extend substantially in parallel to the surface of said substrate while each of the other pair of opposed parallel sides of the parallelogram has a predetermined substantially finite angle Θ with respect to the normal line, and the optical element further comprises attenuation means provided on one of the other pair of opposed parallel sides of the parallelogram for at least reducing reflected radiation of the incident radiation from being reflected out of the side of the parallelogram on which the attenuation means is provided.

5. An optical element according to claim 4, wherein the predetermined substantially finite angle Θ>0.

6. An optical element according to claim 1, wherein the reflective member reflects incident radiation having a wavelength between 3 nm and 150 nm.

7. An optical element according to claim 1, wherein said reflective member is a multilayer having first and second layers respectively comprising first and second substances having different respective refraction factors for one of the vacuum ultraviolet radiation and the X-radiation, and wherein said first and second layers are cyclically arranged in said multilayer.

8. An optical element according to claim 1, wherein said reflective member includes at least one of Ni, Cr, V, W, Ti, C, Ru, Rh, Mo, Pd, Ag, B, Si, N, Be, Cu, Co, Fe and Mn.

9. An optical element according to claim 1, wherein the first reflectivity is the substantially maximum reflectivity for the material.

10. An optical element according to claim 1, wherein a cross-section of said reflective member has a cross-sectional shape other than rectangular, said cross-section being taken in the direction of a normal line to a surface of said member that is generally parallel to the substrate surface.

11. An optical element according to claim 10, wherein the cross-sectional shape of the reflective member is substantially a parallelogram;
  wherein one pair of opposed parallel sides of the parallelogram extend substantially in parallel to the surface of said substrate while each of the other pair of opposed parallel sides of the parallelogram has a predetermined substantially finite angle Θ≧0 with respect to the normal line; and
  wherein the second portion has a cross-sectional area, the ratio of the second portion cross-sectional area to the entire cross-sectional area of said reflective member being smaller when Θ>0 than when Θ=0.

12. An optical element according to claim 11, wherein Θ>0.

13. An optical element, comprising:
  a substrate having a surface; and
  a reflective member having a predetermined thickness, said reflective member being provided on the substrate surface and including a material for reflecting one of vacuum ultraviolet radiation and X-radiation which is incident to said reflective member, the reflectivity of said reflective member with respect to vacuum ultraviolet radiation and X-radiation being relatively higher than the reflectivity, with respect to vacuum ultraviolet radiation and X-radiation, of said substrate surface;
  wherein said reflective member includes a first portion having a first reflectivity to vacuum ultraviolet radiation and X-radiation introduced to said member at a finite incidence angle, and a second portion having a second reflectivity to incident vacuum ultraviolet radiation and X-radiation that is smaller than the first reflectivity.

14. An optical element according to claim 13, wherein the first reflectivity is the substantially maximum reflectivity for the material.

15. An optical element according to claim 13, wherein reflective member reflects incident radiation having a wavelength between 3 nm and 150 nm.

16. An optical element according to claim 13, wherein a cross-section of said reflective member has a cross-sectional shape other than rectangular, said cross-section being taken in the direction of a normal line to a surface of said member that is generally parallel to the substrate surface.

17. An optical element according to claim 13, wherein said reflective member has a cross-sectional shape that is substantially a parallelogram.

18. An optical element according to claim 17,
  wherein the cross-section defining the cross-sectional shape is taken in the direction of a normal line to a surface of said reflective member that is generally parallel to the substrate surface;
  wherein one pair of opposed parallel sides of the parallelogram extend substantially in parallel to the surface of said substrate while each of the other pair of opposed parallel sides of the parallelogram has a predetermined substantially finite angle Θ>0 with respect to the normal line, and the optical element further comprises attenuation means provided on one of the other pair of opposed parallel sides of the parallelogram for at least reducing reflected radiation of the incident radiation from being reflected out of the side of the parallelogram on which the attenuation means is provided.

19. A projection exposure apparatus, comprising:
  a radiation source for irradiating an optical element; and
  an imaging optical system for directing reflected radiation from said optical element to a subject exposure member;
  wherein said optical element includes:
    a substrate having a surface; and
    a reflective member having a predetermined thickness, said reflective member being provided on the substrate surface and including a material for reflecting one of vacuum ultraviolet radiation and X-radiation from said radiation source which is incident to said reflective member, the reflectivity of said reflective member with respect to vacuum ultraviolet radiation and X-radiation being relatively higher than the reflectivity, with respect to vacuum ultraviolet radiation and X-radiation, of said substrate surface;
  the radiation from said radiation source being introduced into a first side face of said reflective member and part of the introduced radiation thereafter reflecting to emerge from a second side face of said reflective member; and
  said reflective member being disposed at a position on said substrate surface at which less than the total reflected radiation emerges from the second side face.

20. A projection exposure apparatus, comprising:
  a radiation source for irradiating an optical element; and
  an imaging optical system for directing reflected radiation from said optical element to a subject exposure member;
  wherein the optical element includes:
    a substrate having a surface; and
    a reflective member having a predetermined thickness, said reflective member being provided on the substrate surface and including a material for reflecting one of vacuum ultraviolet radiation and X-radiation from said radiation source which is incident to said member, the reflectivity of said member with respect to vacuum ultraviolet radiation and X-radiation being relatively higher than the reflectivity, with respect to vacuum ultraviolet radiation and X-radiation, of said substrate surface;

the radiation from said radiation source being introduced into a first side face of said reflective member and thereafter reflecting to emerge from a second side face of said reflective member;

wherein a plurality of said reflective members are provided on said substrate surface such that they are spaced from one another; and wherein the plurality of reflective members are individually disposed at positions on said substrate surface at which less than the total radiation reflected from each member emerges from the second side faces of the members.

21. A projection exposure apparatus, comprising:

a radiation source for irradiating an optical element; and an imaging optical system for directing reflected radiation from said optical element to a subject exposure member, wherein said optical element includes:

a substrate having a surface; and a reflective member having a predetermined thickness, said reflective member being provided on the substrate surface and including a material for reflecting one of vacuum ultraviolet radiation and X-radiation which is incident to said member, the reflectivity of said member with respect to vacuum ultraviolet radiation and X-radiation being relatively higher than the reflectivity, with respect to vacuum ultraviolet radiation and X-radiation, of said substrate surface;

wherein said reflective member includes a first portion through which the incident radiation received from said radiation source is introduced at a finite incidence angle with respect to the direction of a normal line to the surface of said reflective member and is thereafter reflected by said reflective member, the reflectivity of said reflective member with respect to the incident radiation having a first value, and a second portion having reflectivity to the incident radiation of a second value that is smaller than the first value.

22. A projection exposure apparatus according to claim 21, wherein the first value is the substantially maximum reflectivity for the material.

23. A projection exposure apparatus according to claim 21, wherein said reflective member has a cross-sectional shape that is substantially a parallelogram, the cross-section defining the cross-sectional shape being taken in the direction of a normal line to a surface of said reflective member that is generally parallel to the substrate surface;

wherein one pair of opposed parallel sides of the parallelogram extend substantially in parallel to the surface of said substrate while each of the other pair of opposed parallel sides of the parallelogram has a predetermined substantially finite angle $\Theta \geq 0$ with respect to the normal line; and wherein the second portion has a cross-sectional area, the ratio of the second portion cross-sectional area to the entire cross-sectional area of said reflective member being smaller when $\Theta > 0$ than when $\Theta = 0$.

24. A projection exposure apparatus according to claim 23, wherein $\Theta > 0$.

* * * * *